United States Patent
Baek et al.

(10) Patent No.: US 9,490,040 B2
(45) Date of Patent: Nov. 8, 2016

(54) GRAPHENE FOR SEMICONDUCTOR CO-DOPING BORON AND NITROGEN AT THE SAME TIME AND PREPARATION METHOD THEREOF

(71) Applicant: UNIST ACADEMY-INDUSTRY RESEARCH CORPORATION, Ulsan (KR)

(72) Inventors: Jong-Beom Baek, Ulsan (KR); Sun-Min Jung, Gyeonggi-do (KR); In-Yup Jeon, Ulju-gun (KR)

(73) Assignee: UNIST ACADEMY-INDUSTRY RESEARCH CORPORATION, Ulsan (KR)

( * ) Notice: Subject to any disclaimer, the term of this patent is extended or adjusted under 35 U.S.C. 154(b) by 11 days.

(21) Appl. No.: 14/605,738

(22) Filed: Jan. 26, 2015

(65) Prior Publication Data

US 2015/0213915 A1 Jul. 30, 2015

(30) Foreign Application Priority Data

Jan. 27, 2014 (KR) .................. 10-2014-0009713

(51) Int. Cl.
*H01B 1/04* (2006.01)
*B82Y 30/00* (2011.01)
(Continued)

(52) U.S. Cl.
CPC ............. *H01B 1/04* (2013.01); *C01B 31/0446* (2013.01); *H01L 21/0262* (2013.01);
(Continued)

(58) Field of Classification Search
CPC ..... H01B 1/04; C01B 31/04; C01B 31/0446; C01B 21/00; C01B 21/082; C01B 35/00; C01B 35/08; B82Y 30/00; B82Y 40/00

USPC ................ 252/500–519.1; 423/445 R–447.1; 977/896

See application file for complete search history.

(56) References Cited

U.S. PATENT DOCUMENTS

2011/0121409 A1* 5/2011 Seo .................... H01L 21/02115
257/410
2011/0313194 A1* 12/2011 Lee ........................ B82Y 30/00
564/8
(Continued)

FOREIGN PATENT DOCUMENTS

CN 102485647 * 10/2013 ............. C01B 31/04
EP 2801551 A1 * 11/2014 ............. C01B 31/04
(Continued)

OTHER PUBLICATIONS

Rani ("Stability and electronic properties of isomers of B/N co-doped graphene." App Nanosc, online Nov. 2013).*
(Continued)

*Primary Examiner* — Tri V Nguyen
(74) *Attorney, Agent, or Firm* — J. Rodman Steele, Jr.; Gregory M. Lefkowitz; Duane Morris LLP

(57) ABSTRACT

Disclosed are boron/nitrogen co-doped graphene for semiconductor applications and a method for producing the same. The boron/nitrogen co-doping allows the use of the doped graphene in a wider variety of applications, including semiconductors. In contrast, graphene structures produced by conventional methods have good physical, chemical, and electrical stability but cannot be used in semiconductor applications due to the absence of band gaps therein. In addition, the boron/nitrogen co-doping makes the doped graphene highly dispersible in organic solvents.

4 Claims, 9 Drawing Sheets

(51) Int. Cl.
  *B82Y 40/00* (2011.01)
  *C01B 31/04* (2006.01)
  *H01L 29/16* (2006.01)
  *H01L 21/02* (2006.01)
  *H01L 29/66* (2006.01)
  *H01L 29/786* (2006.01)

(52) U.S. Cl.
  CPC .. *H01L 21/02527* (2013.01); *H01L 21/02576* (2013.01); *H01L 21/02579* (2013.01); *H01L 29/1606* (2013.01); *H01L 29/66742* (2013.01); *H01L 29/78684* (2013.01); *H01L 29/78696* (2013.01)

(56) References Cited

U.S. PATENT DOCUMENTS

| | | | | |
|---|---|---|---|---|
| 2014/0120270 A1* | 5/2014 | Tour | ................ | C23C 16/26 427/596 |
| 2014/0218842 A1* | 8/2014 | Lin | ................ | H01G 9/0425 361/500 |
| 2014/0256120 A1* | 9/2014 | Guo | ................ | C01B 31/0446 438/507 |

FOREIGN PATENT DOCUMENTS

KR 1020110016287 2/2011
KR 1020110138611 12/2011

OTHER PUBLICATIONS

Deng ("Toward N-Doped Graphene via Solvothermal Synthesis." Chem Mater, 23, pp. 1188-1193, pub Jan. 26, 2011).*

Li ("Low-Temperature Growth of Graphene by Chemical Vapor Deposition Using Solid and Liquid Carbon Sources." ACS Nano, 5(4), pp. 3385-3390, Mar. 2011).*

Abstract of Q. Zhu et al., "Solvothermal synthesis of boron-doped graphene and nitrogen-doped graphene and their electrical," J. Renewable Sustainable Energy. 2013, vol. 5, Article No. 021408, Published date: Mar. 27, 2013.

* cited by examiner

GRAPHENE FOR SEMICONDUCTOR CO-DOPING BORON AND NITROGEN AT THE SAME TIME AND PREPARATION METHOD THEREOF

BACKGROUND OF THE INVENTION

Field of the Invention

The present invention relates to boron/nitrogen co-doped graphene for semiconductor applications and a method for producing the same.

Description of the Related Art

Carbon materials, such as fullerenes, carbon nanotubes, graphene, and graphite composed of carbon atoms have attracted increasing attention in recent years.

Particularly, research on carbon nanotubes and graphene is actively underway. Graphene can be formed on a large area and possesses high conductivity as well as good electrical, mechanical and chemical stability. Due to these advantages, graphene is gaining particular interest as a basic material for electronic circuits.

Graphene is a basic building block for graphite and is a thin film whose thickness corresponds to that of one carbon atom.

Graphene is a two-dimensional planar material consisting of covalently bonded carbon atoms in a hexagonal arrangement. Graphene has excellent physicochemical properties, a specific surface area as large as about 2,000-3,000 $cm^2/g$, and superior thermal and electrical conductivity.

Graphene production processes can be broadly classified into two approaches: bottom up and top down processes. According to a representative bottom up process, graphene is synthesized by chemical vapor deposition and epitaxy of a carbon precursor on a suitable substrate, such as a metal or silicon substrate. This process enables the synthesis of high-quality graphene depending on reaction conditions but requires high temperatures for graphene synthesis. Another problem is that the yield of graphene is limited depending on the area of the substrate used.

Meanwhile, according to a representative top down process, planar graphite is oxidized, a sheet of graphene is exfoliated from the oxidized graphite, and the graphene oxide is reduced. This oxidation/reduction process uses a strong acid for the oxidation and a strong reducing agent for the reduction. However, the graphene structure damaged by the oxidation is not fully recovered to its original state even after the reduction. Other examples of top down processes for graphene production include edge exfoliation and ball milling. According to the edge exfoliation process, edges of graphene sheets constituting graphite are selectively functionalized, followed by exfoliation. According to the ball milling process, graphene is isolated from graphite by mechanical exfoliation.

Graphene doping processes can be divided into physical doping and chemical doping. Physical doping is based on physical binding between graphene and doping agents and is thus susceptible to external environmental factors. This susceptibility makes it difficult to continuously maintain the doping effects. In contrast, chemical doping is based on chemical bonding between dissimilar elements and graphene and is thus advantageous in continuously maintaining the doping effects. The physical properties of graphene vary depending on the characteristics of dissimilar elements introduced into graphene and can thus be controlled as desired by varying the amounts and kinds of the dissimilar elements.

On the other hand, graphene produced by the bottom-up or top-down process is a semi-metallic material with high electron mobility. However, the graphene cannot be applied to semiconductors for on/off control in logic elements due to the absence of band gap therein. Thus, there is a continued need for research aimed at finding available graphene for semiconductor applications based on chemical doping. Despite this, such research is in its infancy.

As the prior art, Korean Patent Publication No. 10-2011-0016287 ("Patent Document 1") relates to a method for coating with graphene oxide. Specifically, a colloidal graphene oxide solution is directly coated on the surfaces of various bases, dried, and thermally processed to form graphene thin films on the bases. However, Patent Document 1 neither discloses nor suggests a technique associated with the use of graphene in semiconductor applications by forming a band gap in the graphene.

SUMMARY OF THE INVENTION

The present invention has been made in an effort to solve the above problems, and it is an object of the present invention to provide chemically doped graphene suitable for use in semiconductor applications and a method for producing the doped graphene.

According to one aspect of the present invention, there is provided boron/nitrogen co-doped graphene for semiconductor applications wherein the doping is performed after an alkali metal in Group 1 of the Periodic Table or an alkaline earth metal in Group 2 of the Periodic Table is chemically bonded to a carbon precursor.

The boron/nitrogen doping is performed using a boron precursor and a nitrogen precursor and the boron precursor is a compound in which a halogen selected from the group consisting of F, Cl, Br, and I is bonded to boron.

The boron precursor is selected from the group consisting of BF, $BF_3$, $BCl_3$, $BBr_3$, $BI_3$, and mixtures thereof and the nitrogen precursor is selected from the group consisting of $N_2$, $NH_3$, $NF_3$, NCl, $NBr_3$, $NI_3$, $NHCl_2$, $NH_2Cl$, $NF_5$, $N_2F_4$, $N_2Cl_4$, and mixtures thereof.

The carbon precursor is a compound in which a halogen selected from the group consisting of F, Cl, Br, and I is bonded to carbon.

The carbon precursor is selected from the group consisting of $CF_4$, $C_2F_4$, $CF_6$, $CCl_4$, $C_2Cl_4$, $CCl_6$, $C_6Cl_6$, $CBr_4$, $C_2Br_4$, $C_6Br_6$, $CI_4$, $C_2I_4$, $C_6I_6$, and mixtures thereof.

The graphene is doped with 0.01 to 5.00 at. % of boron and 0.01 to 5.00 at. % of nitrogen.

The alkali metal is selected from the group consisting of lithium, sodium, potassium, rubidium, cesium, francium, and mixtures thereof and the alkaline earth metal is selected from the group consisting of beryllium, magnesium, calcium, strontium, barium, radium, and mixtures thereof.

The doped graphene has a band gap of 0.1 to 5 eV.

According to another aspect of the present invention, there is provided a method of producing doped graphene for semiconductor applications, including 1) adding a carbon precursor and an alkali metal or alkaline earth metal to a closed container, 2) adding a boron precursor and a nitrogen precursor to the closed container, and 3) raising the internal temperature of the closed container and maintaining the temperature.

The boron precursor is a compound in which a halogen selected from the group consisting of F, Cl, Br, and I is bonded to boron.

The boron precursor is selected from the group consisting of BF, $BF_3$, $BCl_3$, $BBr_3$, $BI_3$, and mixtures thereof and the nitrogen precursor is selected from the group consisting of $N_2$, $NH_3$, $NF_3$, NCl, $NBr_3$, $NI_3$, $NHCl_2$, $NH_2Cl$, $NF_5$, $N_2F_4$, $N_2Cl_4$, and mixtures thereof.

The carbon precursor is a compound in which a halogen selected from the group consisting of F, Cl, Br, and I is bonded to carbon.

The carbon precursor is selected from the group consisting of $CF_4$, $C_2F_4$, $CF_6$, $CCl_4$, $C_2Cl_4$, $CCl_6$, $C_6Cl_6$, $CBr_4$, $C_2Br_4$, $C_6Br_6$, $CI_4$, $C_2I_4$, $C_6I_6$, and mixtures thereof.

In step 1), the carbon precursor and the alkali metal or alkaline earth metal are added in amounts of 0.01 to 20% by volume.

According to the method of the present invention, 0.01 to 5.00 at. % of boron and 0.01 to 5.00 at. % of nitrogen are co-doped into graphene.

In step 3), the internal temperature of the closed container is raised to 50 to 400° C. and is maintained for 0.5 to 12 hours.

In step 1), the carbon precursor and the alkali metal or alkaline earth metal are added in a total amount of 10 to 30% by volume, based on the volume of the closed container.

The nitrogen/boron co-doping allows the use of the doped graphene according to the present invention in a wider variety of applications, including semiconductors. In contrast, graphene structures produced by conventional methods have good physical, chemical, and electrical stability but cannot be used in semiconductor applications due to the absence of band gaps therein. In addition, the nitrogen/boron co-doping makes the doped graphene of the present invention highly dispersible in organic solvents.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
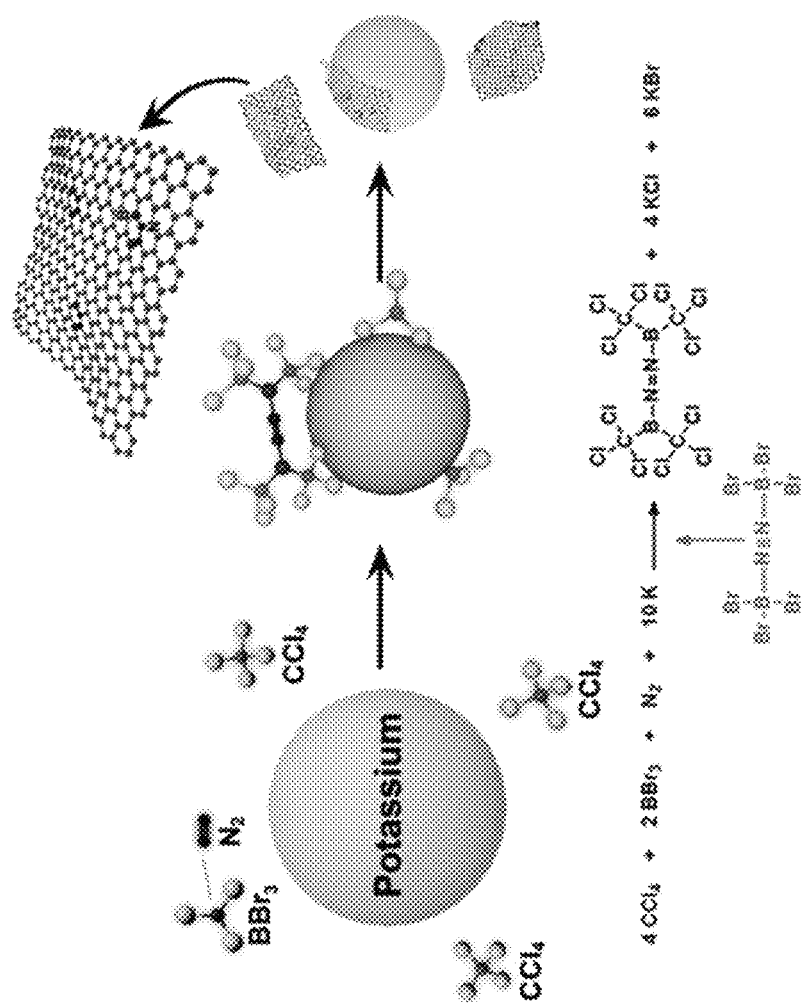
FIG. 1 is a diagram showing the mechanism of co-doping of boron and nitrogen into a graphene structure.

As a result of earnest and intensive research to develop graphene for semiconductor applications, the present inventors have found that graphene co-doped with boron and nitrogen is suitable for use in semiconductor applications. The present inventors have also found a method for producing the doped graphene. The present invention has been accomplished based on these findings.

Specifically, the present invention provides boron/nitrogen co-doped graphene for semiconductor applications wherein the doping is performed after an alkali metal in Group 1 of the Periodic Table or an alkaline earth metal in Group 2 of the Periodic Table is chemically bonded to a carbon precursor.

The co-doping of graphene with boron and nitrogen enables the formation of a band gap in the graphene. As a result, the doped graphene can be used in semiconductor applications, which has previously been difficult to achieve. In addition, the graphene co-doped with both boron and nitrogen exhibits markedly improved dispersibility compared to graphene doped with either boron or nitrogen.

The reason why the doping is performed after an alkali metal in Group 1 of the Periodic Table or an alkaline earth metal in Group 2 of the Periodic Table is chemically bonded to a carbon precursor is because larger amounts of boron and nitrogen can be doped. The chemical bonding is not particularly limited but is preferably covalent bonding.

The boron/nitrogen doping is performed using a boron precursor and a nitrogen precursor. The boron precursor may be a boron halide but is not particularly limited thereto. Preferably, the boron precursor is a compound in which a halogen selected from the group consisting of F, Cl, Br, and I is bonded to boron. More preferably, the boron precursor is selected from the group consisting of BF, $BF_3$, $BCl_3$, $BBr_3$, $BI_3$, and mixtures thereof. The nitrogen precursor is selected from the group consisting of $N_2$, $NH_3$, $NF_3$, NCl, $NBr_3$, $NI_3$, $NHCl_2$, $NH_2Cl$, $NF_5$, $N_2F_4$, $N_2Cl_4$, and mixtures thereof.

The carbon precursor may be a carbon halide but is not particularly limited thereto. Preferably, the carbon precursor is a compound in which a halogen selected from the group consisting of F, Cl, Br, and I is bonded to carbon. More preferably, the carbon precursor is selected from the group consisting of $CF_4$, $C_2F_4$, $CF_6$, $CCl_4$, $C_2Cl_4$, $CCl_6$, $C_6Cl_6$, $CBr_4$, $C_2Br_4$, $C_6Br_6$, $CI_4$, $C_2I_4$, $C_6I_6$, and mixtures thereof.

The graphene is doped with 0.01 to 5.00 at. % of boron and 0.01 to 5.00 at. % of nitrogen. Within these ranges, a high band gap can be formed in the doped graphene, allowing the use of the doped graphene in semiconductor applications and ensuring improved dispersibility of the doped graphene.

The alkali metal is selected from the group consisting of lithium, sodium, potassium, rubidium, cesium, francium, and mixtures thereof and the alkaline earth metal is selected from the group consisting of beryllium, magnesium, calcium, strontium, barium, radium, and mixtures thereof.

The doped graphene of the present invention has a band gap of 0.1 to 5 eV, which corresponds to that of a semiconductor. Accordingly, the doped graphene of the present invention can be used in semiconductor applications.

In another aspect, the present invention provides a method of producing doped graphene for semiconductor applications, including
1) adding a carbon precursor and an alkali metal or alkaline earth metal to a closed container,
2) adding a boron precursor and a nitrogen precursor to the closed container, and
3) raising the internal temperature of the closed container and maintaining the temperature.

According to the method of the present invention, a band gap can be formed in graphene, which allows the use of the graphene in semiconductor applications.

The boron precursor may be a boron halide but is not particularly limited thereto. Preferably, the boron precursor is a compound in which a halogen selected from the group consisting of F, Cl, Br, and I is bonded to boron. More preferably, the boron precursor is selected from the group consisting of $BF$, $BF_3$, $BCl_3$, $BBr_3$, $BI_3$, and mixtures thereof. The nitrogen precursor is selected from the group consisting of $N_2$, $NH_3$, $NF_3$, $NCl$, $NBr_3$, $NI_3$, $NHCl_2$, $NH_2Cl$, $NF_5$, $N_2F_4$, $N_2Cl_4$, and mixtures thereof.

The carbon precursor may be a carbon halide but is not particularly limited thereto. Preferably, the carbon precursor is a compound in which a halogen selected from the group consisting of F, Cl, Br, and I is bonded to carbon. More preferably, the carbon precursor is selected from the group consisting of $CF_4$, $C_2F_4$, $CF_6$, $CCl_4$, $C_2Cl_4$, $CCl_6$, $C_6Cl_6$, $CBr_4$, $C_2Br_4$, $C_6Br_6$, $CI_4$, $C_2I_4$, $C_6I_6$, and mixtures thereof.

In step 1), the carbon precursor and the alkali metal or alkaline earth metal are preferably added in amounts of 0.01 to 20% by volume. Within this range, doping of graphene with sufficient amounts of boron and nitrogen can be induced after the alkali metal or alkaline earth metal is chemically bonded to the carbon precursor.

According to the method of the present invention, 0.01 to 5.00 at. % of boron and 0.01 to 5.00 at. % of nitrogen are co-doped into graphene.

In step 3), it is preferred to raise the internal temperature of the closed container to 50 to 400° C. and maintain the temperature for 0.5 to 12 hours. This temperature profile enables doping of graphene with larger amounts of boron and nitrogen.

In step 1), the carbon precursor and the alkali metal or alkaline earth metal are preferably added in a total amount of 10 to 30% by volume, based on the volume of the closed container.

The present invention will be explained in detail in such a manner that those with ordinary knowledge in the art can easily carry out the invention with reference to the following preferred embodiments. The present invention may, however, be embodied in many different forms and is not limited to the embodiments as set forth herein.

EXAMPLES

Example 1

4 ml of carbon tetrachloride ($CCl_4$) and 7.6 g of potassium (K) were put in an autoclave and 0.39 ml of boron tribromide ($BBr_3$) was introduced into the autoclave under a nitrogen atmosphere. The mixture was heated at 270° C. for 30 min to produce graphene flakes co-doped with 2.38 at. % of boron and 2.66 at. % of nitrogen. FIG. 1 shows the mechanism of the production of the doped graphene and an image of the doped graphene.

COMPARATIVE EXAMPLES

Comparative Example 1

Graphene flakes were produced in the same manner as in Example 1, except that the boron precursor was not introduced.

Comparative Example 2

Graphene flakes were produced in the same manner as in Example 1, except that the nitrogen atmosphere was changed to an argon atmosphere.

EXPERIMENTAL EXAMPLES

Experimental Example 1

Band Gap Measurement

The band gap of the graphene flakes produced in Example 1 was measured by UV-Vis spectroscopy. The results are shown in FIG. 2.

Figure 2:
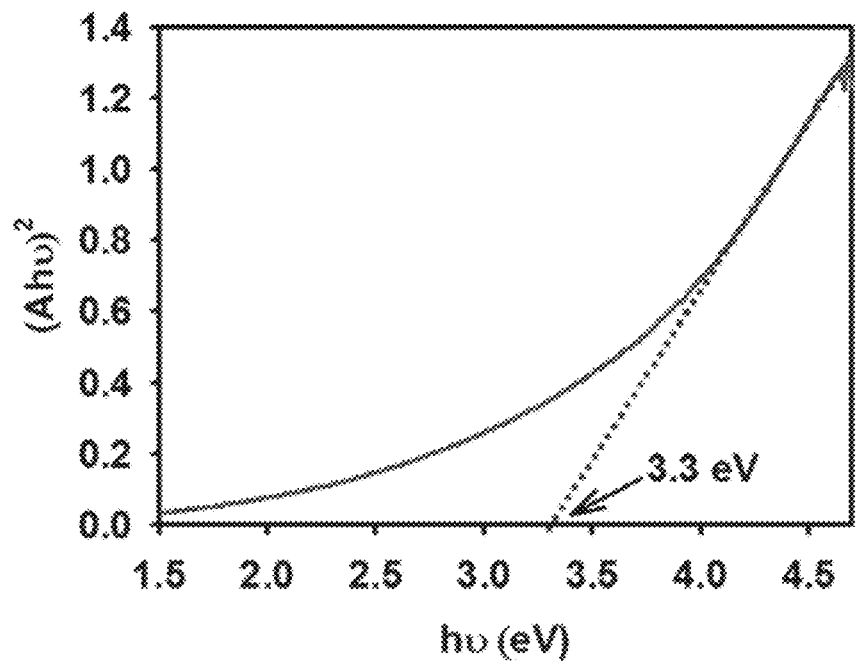
FIG. 2 is a graph showing the band gap of doped graphene produced in Example 1, which was calculated by UV-Vis spectroscopy.

As shown in FIG. 2, the band gap of the nitrogen/boron co-doped graphene was calculated to be 3.3 eV, which is sufficiently higher than the band gaps of undoped graphene (0 eV) and conventional doped graphene structures (≤3.0 eV). The results of the experiment indicated that the doped graphene can be used for on/off control and has semiconductor properties, which can be explained by its high band gap.

Experimental Example 2

Measurement of Semiconductor Properties Using Field-Effect Transistor

Figure 3:
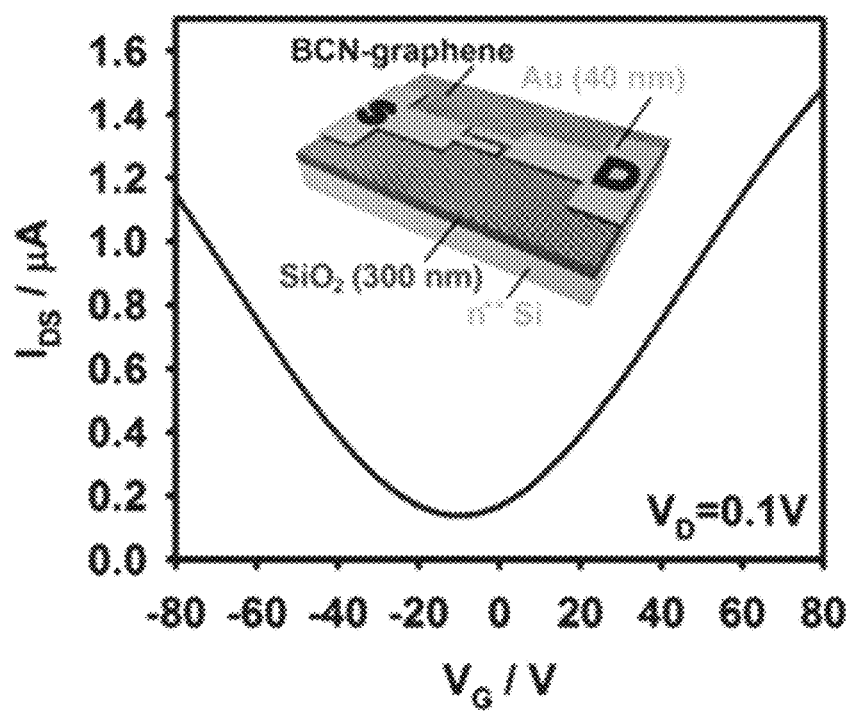
FIG. 3 is a current/voltage curve for a field-effect transistor employing doped graphene produced in Example 1.

A field-effect transistor was fabricated using the boron/nitrogen co-doped graphene of Example 1. A current/voltage curve was plotted for a field-effect transistor to make sure whether the doped graphene showed semiconductor properties. The results are shown in FIG. 3.

Experimental Example 3

Measurement of Degrees of Dispersion

An experiment was made to determine whether the boron/nitrogen co-doped graphene of Example 1 was more effectively dispersed in N-methyl-2-pyrrolidone (NMP) as an organic solvent than the graphene structures of Comparative Examples 1-2. For this experiment, the degrees of dispersion of the graphene structures were measured after dipping in the organic solvent for 2 months. The results are shown in FIG. 4.

Figure 4:
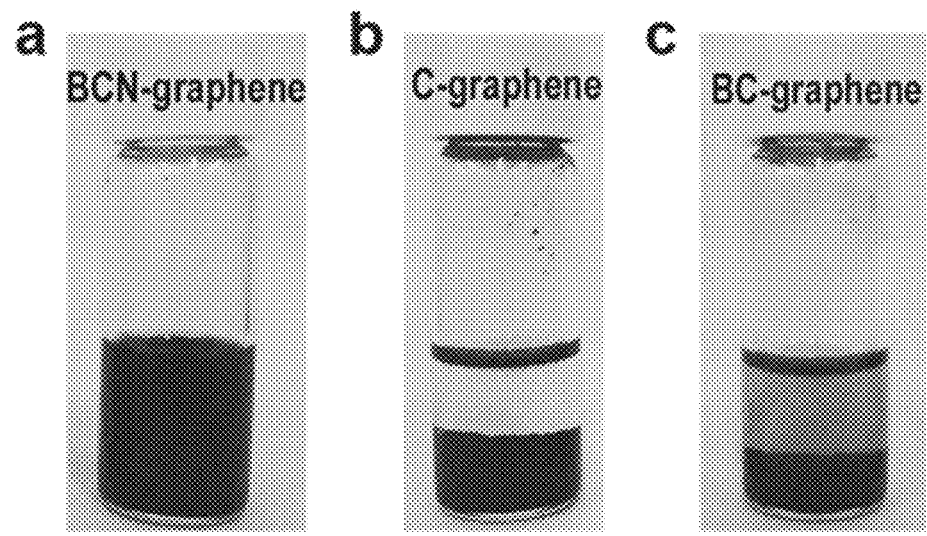
FIG. 4 shows images comparing the degrees of dispersion of graphene structures produced in Example 1 and Comparative Examples 1 and 2.

FIG. 4 shows that the doped graphene of Example 1 (FIG. 4a) was stably dispersed for 2 months, while the graphene structures of Comparative Examples 1 (FIG. 4b) and 2 (FIG. 4c) were unstably dispersed for 2 months. From these results, it can be confirmed that the doped graphene of Example 1 possessed better dispersibility than the graphene structures of Comparative Examples 1-2, demonstrating suitability of the doped graphene of Example 1 for semiconductor applications compared to the graphene structures of Comparative Examples 1-2.

(FIG. 7a), Comparative Example 1 (FIG. 7b), and Comparative Example 2 (FIG. 7c).

Figure 8:
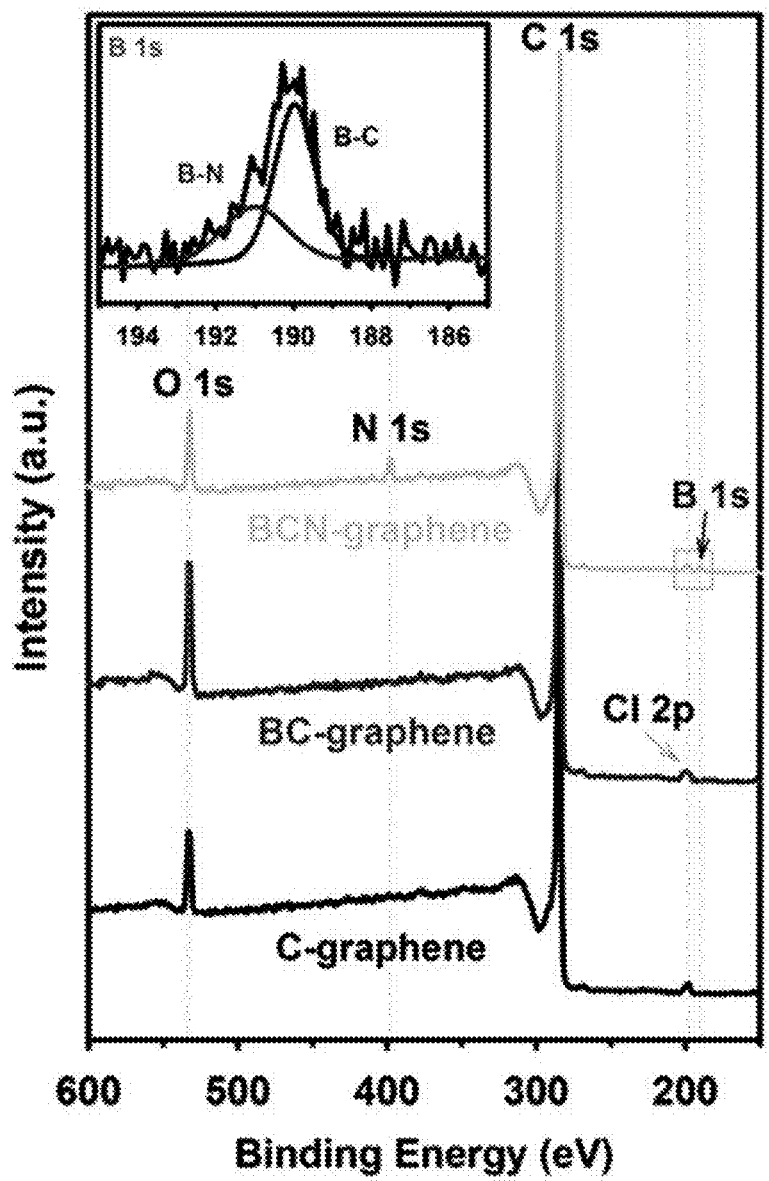
FIG. 8 is a graph showing the results of elemental analysis of graphene structures produced in Example 1 and Comparative Examples 1 and 2.

FIG. 8 is a graph showing the results of elemental analysis of the graphene structures produced in Example 1 (BCN-graphene) and Comparative Examples 1 (C-graphene) and 2 (BC-graphene). The constituent elements of the graphene flakes were analyzed by X-ray photoelectron spectroscopy (XPS).

Table 1 shows the contents of the elements of the graphene structures produced in Example 1 and Comparative Examples 1-2.

TABLE 1

| Sample | C (at. %) | B (at. %) | Br (at. %) | Cl (at. %) | N (at. %) | O (at. %) | C/B | C/N |
|---|---|---|---|---|---|---|---|---|
| C-graphene | 92.46 | BDL$^a$ | BDL$^a$ | 1.05 | 0.59 | 5.90 | NA$^b$ | 182.2 |
| BC-graphene | 87.47 | BDL$^a$ | 0.28 | 1.28 | 0.73 | 10.07 | NA$^b$ | 139.7 |
| BCN-graphene | 84.41 | 2.38 | BDL$^a$ | 1.07 | 2.66 | 9.47 | 31.9 | 37.0 |

$^a$BDL = Below detection limit or not available.
$^b$NA = Not applicable.

Experimental Example 4

Graphene Structures Produced at Different Reaction Temperatures

Graphene structures were produced in the same manner as in Example 1, except that the temperature of the autoclave was changed. The decomposition of the graphene structures and the graphene structure of Example 1 was observed. The results are shown in FIG. 5.

Figure 5:
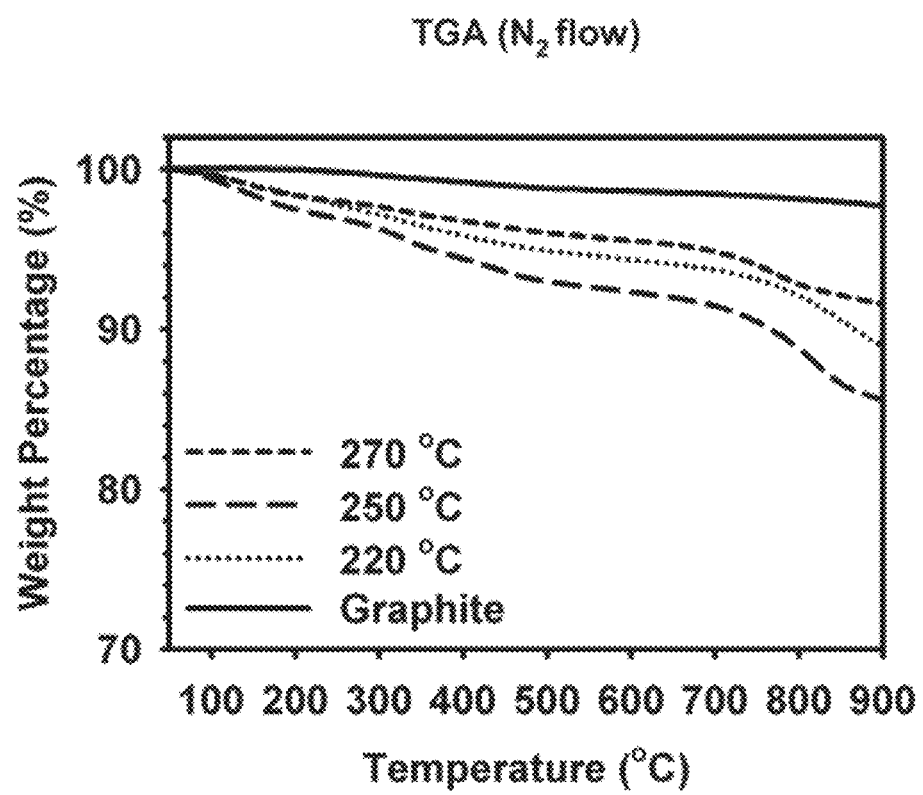
FIG. 5 is a graph showing the decomposition temperatures of graphene structures produced after reaction at different temperatures, which were measured in Experimental Example 4.

As shown in FIG. 5, more desirable results were obtained in the temperature range of 50-400° C. Particularly, the graphene was judged to be thermally stable when it underwent less weight loss with increasing temperature. FIG. 5 shows good thermal stability of the graphene produced after reaction at 270° C.

Experimental Example 5

Graphene Structures Produced for Different Reaction Times

Graphene structures were produced in the same manner as in Example 1, except that the reaction time was changed while maintaining the temperature of the autoclave. The results are shown in FIG. 6.

Figure 6:
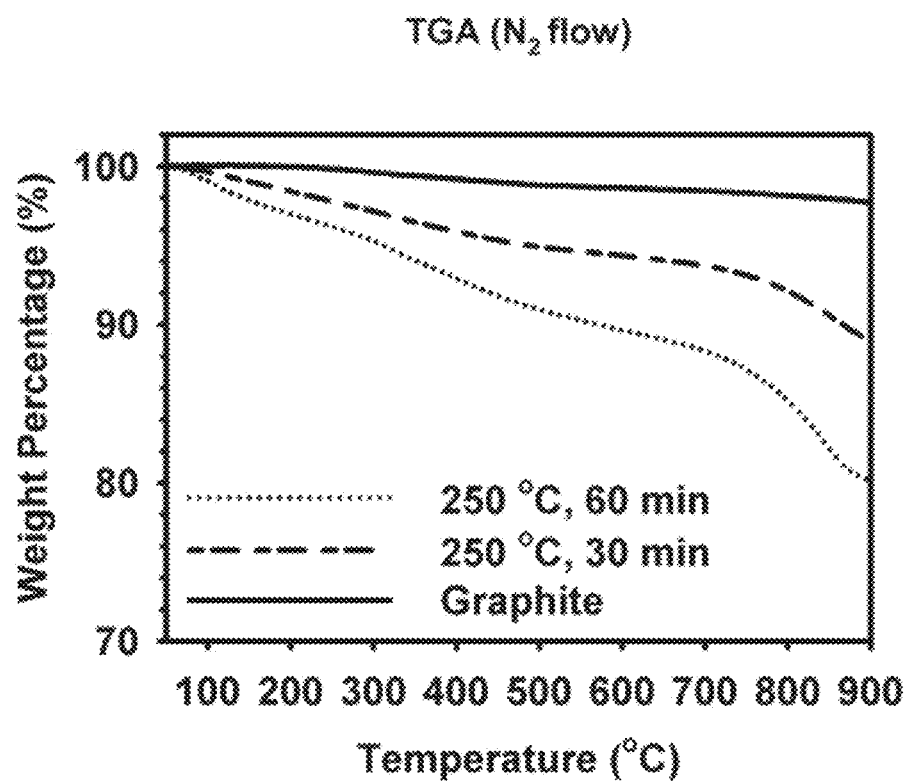
FIG. 6 is a graph showing the decomposition temperatures of graphene structures produced after reaction for different times, which were measured in Experimental Example 5.

As shown in FIG. 6, the graphene structures began to form after 30 min following the reaction, which was monitored through their thermal stability and electron microscopy. The graphene structure formed after reaction for 12 h showed similar results to that formed after reaction for 0.5 h. From these observations, it was concluded that it is preferable to maintain the elevated temperature for 0.5-12 h. FIG. 6 shows that the graphene structure formed after reaction for 0.5 h showed more desirable results than that formed after reaction 1 h.

Experimental Example 6

Other Measurement Results and Degrees of Doping

Figure 7:
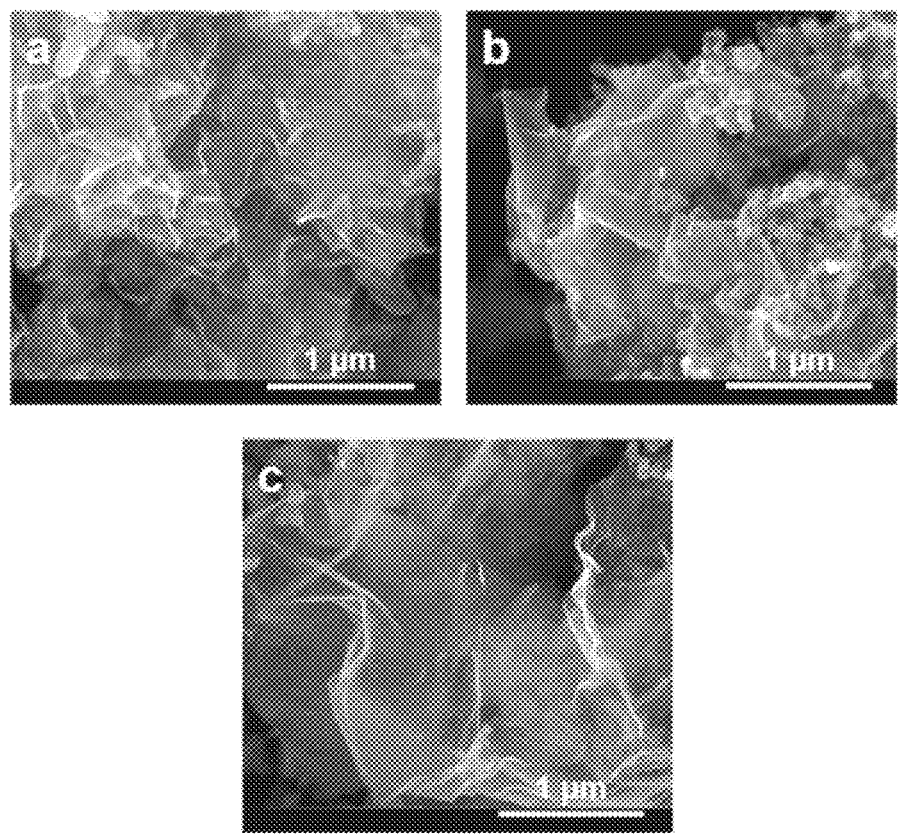
FIG. 7 shows scanning electron microscopy (SEM) images of graphene structures produced in Example 1 and Comparative Examples 1 and 2.

FIG. 7 shows scanning electron microscopy (SEM) images of the graphene structures produced in Example 1

Figure 9:
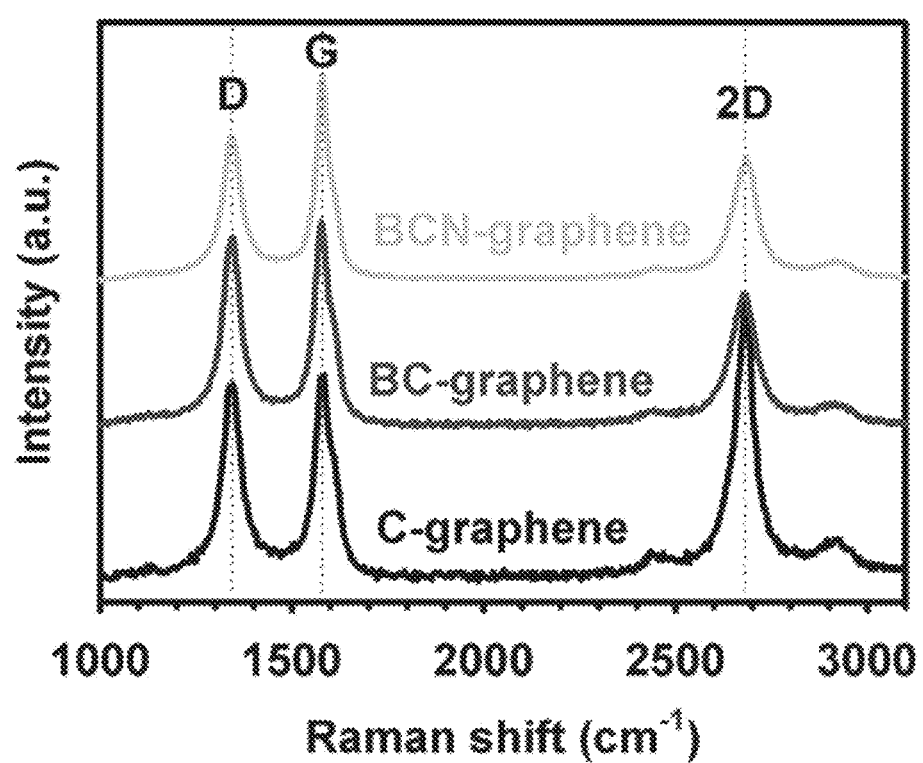
FIG. 9 shows Raman spectra of graphene structures produced in Example 1 and Comparative Examples 1 and 2.

FIG. 9 shows Raman spectra of the graphene structures (Example 1: BCN-graphene, Comparative Example 1: C-graphene, Comparative Example 2: BC-graphene).

The constituent elements of the graphene flakes produced in Example 1 and Comparative Examples 1-2 were analyzed by X-ray photoelectron spectroscopy (XPS). The results are shown in FIG. 8. Peaks corresponding to boron and nitrogen were observed in the boron/nitrogen co-doped graphene of Example 1. The contents of the individual elements were precisely calculated from FIG. 9.

The preferred embodiments of the present invention have been described herein, but the scope of the present invention is not limited thereto. It should be understood that various modifications are possible without departing from the spirit of the invention and such modifications are intended to come within the scope of the appended claims.

What is claimed is:

1. A method of producing doped graphene for semiconductor applications, comprising
   1) adding a carbon halide precursor and an alkali metal or alkaline earth metal to a closed container,
   2) adding a boron precursor and a nitrogen precursor to the closed container, and
   3) raising the internal temperature of the closed container to 50° C. to 400° C. and maintaining the temperature within the closed container, wherein the carbon halide precursor is selected from the group consisting of $CF_4$, $C_2F_4$, $CF_6$, $CCl_4$, $C_2Cl_4$, $CCl_6$, $C_6Cl_6$, $CBr_4$, $C_2Br_4$, $C_6Br_6$, $CI_4$, $C_2I_4$, $C_6I_6$, and mixtures thereof, the boron precursor is selected from the group consisting of BF, $BF_3$, $BCl_3$, $BBr_3$, $BI_3$, and mixtures thereof, wherein the nitrogen precursor is selected from the group consisting of $N_2$, $NH_3$, $NF_3$, NCl, $NBr_3$, $NI_3$, $NHCl_2$, $NH_2Cl$, $NF_5$, $N_2F_4$, $N_2Cl_4$, and mixtures thereof, wherein 0.01% to 5.00% of the boron precursor and 0.01% to 5.00% of nitrogen precursor are co-doped into graphene.

2. The method according to claim 1, wherein, in step 1), the carbon precursor and the alkali metal or alkaline earth metal are added in amounts of 0.01 to 20% by volume.

3. The method according to claim 1, wherein, in step 3), the internal temperature of the closed container is maintained for 0.5 to 12 hours.

4. The method according to claim 1, wherein, in step 1), the carbon precursor and the alkali metal or alkaline earth metal are added in a total amount of 10 to 30% by volume, based on the volume of the closed container.

* * * * *